United States Patent
Kumakura et al.

(10) Patent No.: US 7,329,141 B2
(45) Date of Patent: Feb. 12, 2008

(54) METHOD FOR SHIELDING FLAT CIRCUIT BODY, SHIELDED FLAT CIRCUIT BODY, AND WIRING HARNESS

(75) Inventors: Hideto Kumakura, Shizuoka (JP); Nobuyuki Asakura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/384,239

(22) Filed: Mar. 21, 2006

(65) Prior Publication Data
US 2006/0264092 A1 Nov. 23, 2006

(30) Foreign Application Priority Data
May 23, 2005 (JP) .............................. 2005-149510

(51) Int. Cl.
*H01R 4/24* (2006.01)
(52) U.S. Cl. ...................................... 439/422; 439/425
(58) Field of Classification Search ................ 439/422, 439/421, 423, 425; 174/84
See application file for complete search history.

(56) References Cited

U.S. PATENT DOCUMENTS

| | | | | |
|---|---|---|---|---|
| 3,697,925 A | * | 10/1972 | Henschen | .................... 439/494 |
| 3,703,604 A | * | 11/1972 | Henschen et al. | ......... 174/75 R |
| 4,258,974 A | * | 3/1981 | Kuo et al. | .................... 439/412 |
| RE31,336 E | * | 8/1983 | Weinmann et al. | ............ 29/868 |
| 4,950,180 A | * | 8/1990 | Daly et al. | .................... 439/422 |
| 6,135,806 A | * | 10/2000 | Pohjola | ...................... 439/425 |
| 6,736,664 B2 | * | 5/2004 | Ueda et al. | .................. 439/423 |
| 2002/0009919 A1 | * | 1/2002 | Yamanashi et al. | .......... 439/425 |

FOREIGN PATENT DOCUMENTS

JP 0348954 A2 * 3/1990

* cited by examiner

*Primary Examiner*—Michael C. Zarroli
(74) *Attorney, Agent, or Firm*—Kratz, Quintos & Hanson, LLP

(57) ABSTRACT

A method of shielding a flat circuit body and a wiring harness including the shielded flat circuit body, the shielded flat circuit body of the wiring harness includes a FFC having insulator covering around a conductor, a shield film covering the FFC and a connecting terminal. A clamp blade is pierced through an end of the FFC and is bent so as to connect electrically to the conductor. A joint blade extending perpendicularly from a joint terminal, which connects a plurality of conductors to each other, is pierced through the shield film and the FFC in the same direction of piercing the clamp blade, and is bent so as to connect the conductor and the shield film electrically.

8 Claims, 8 Drawing Sheets

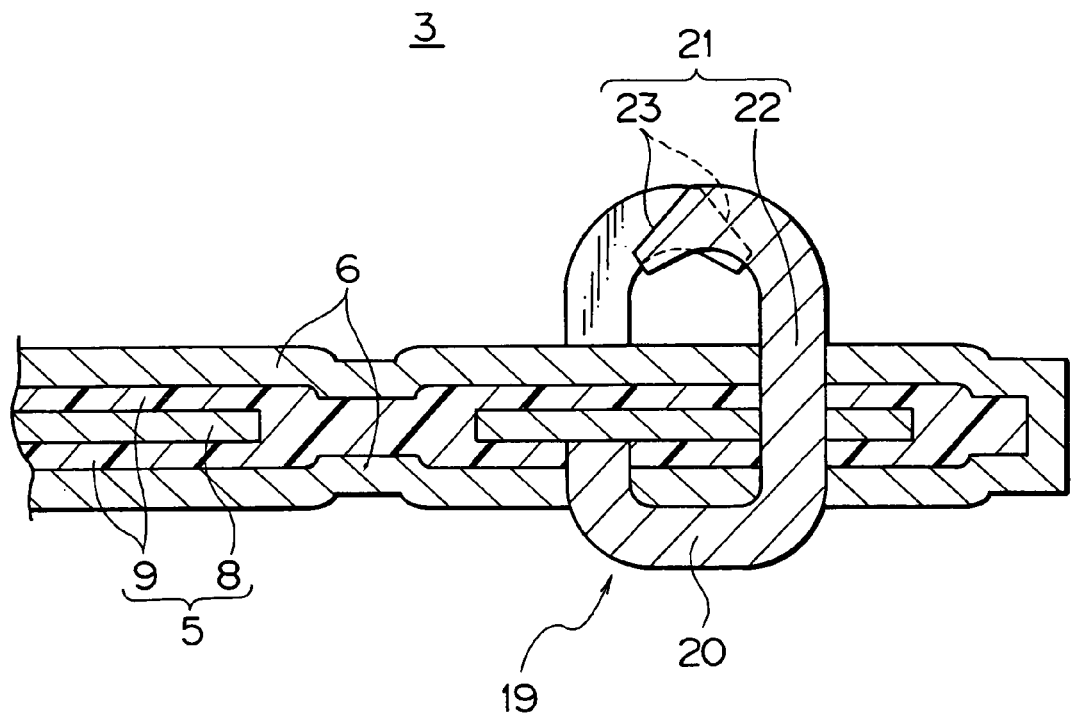
F I G. 5
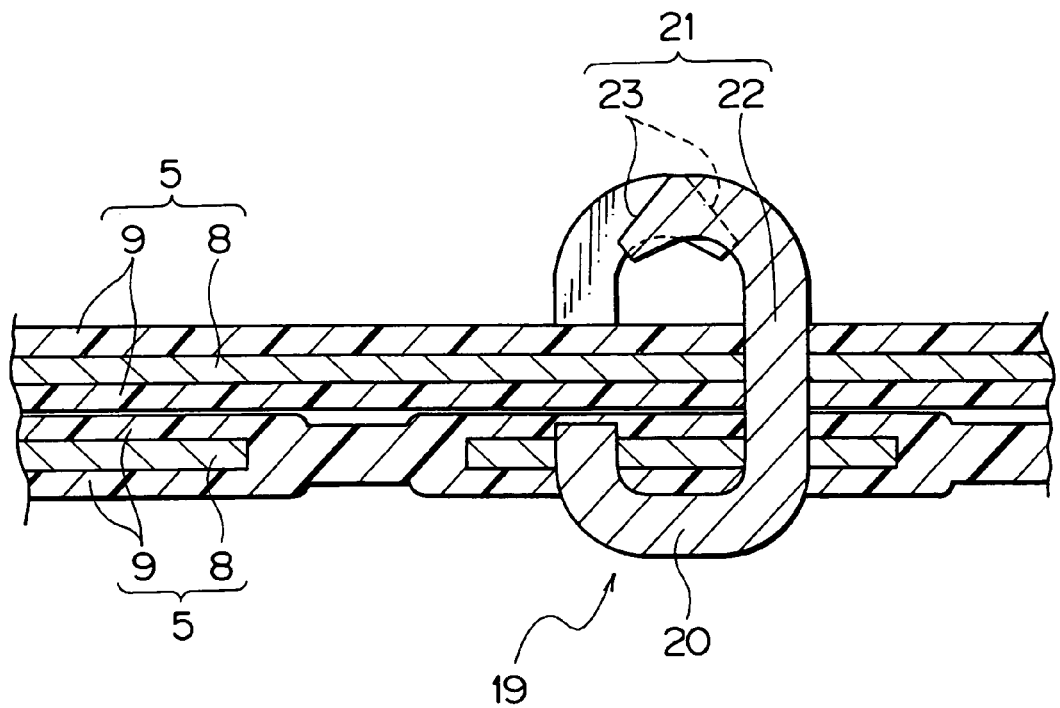
F I G. 9

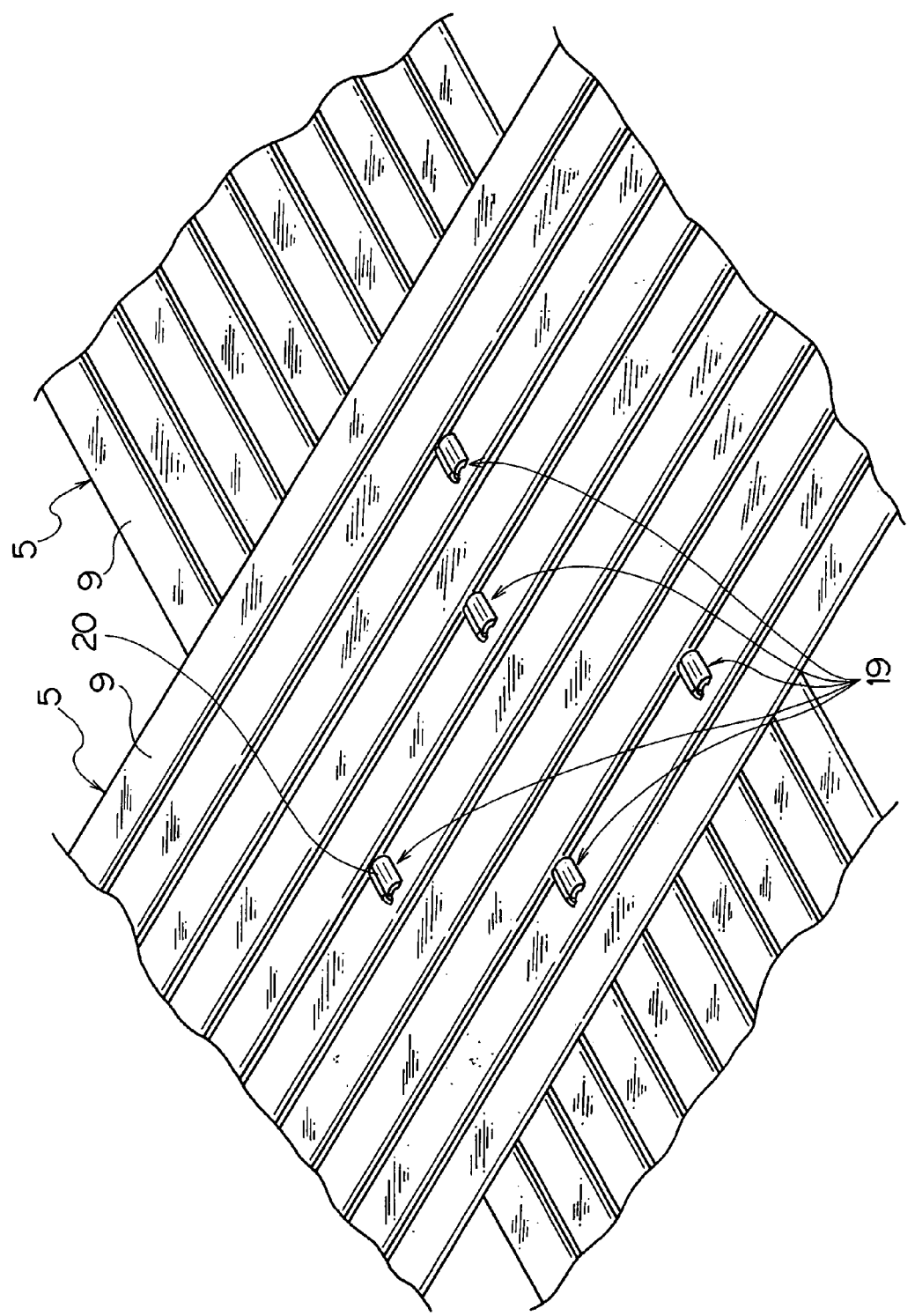

METHOD FOR SHIELDING FLAT CIRCUIT BODY, SHIELDED FLAT CIRCUIT BODY, AND WIRING HARNESS

The priority application Number Japan Patent Application 2005-149510 upon which this patent application is based is hereby incorporated by reference.

BACKGROUND OF THE INVENTION

1. Field of the Invention

This invention relates to a shielding method of a flat circuit body, such as a FPC(Flexible Printed Circuit) and a FFC (Flexible Flat Cable), to be covered by a shield film as a shielded flat circuit body and a wiring harness having the shielded flat circuit body.

2. Description of the Related Art

Various electronic apparatuses are installed in a car as a vehicle. In the car, a wiring harness 50 (shown in FIG. 10) is wired for transmitting electric power from a power supply, such as a battery, and control signals from a controller to the electronic apparatus. The wiring harness 50 shown in FIG. 10 includes a connector housing (not shown) and a shielded FFC 51. The connector housing receives a later-described terminal 53 of the shielded FFC 51 therein.

The shielded FFC 51 has a flat cable 52 and a terminal 53. The flat cable 52 has a plurality of conductors 54 arranged in parallel to each other, an insulator 55 insulating the conductors 54 from each other and a shield film 56. The conductor 54 is made of copper alloy, such as brass so as to be conductive. The insulator 55 is made of for example polyethyleneterephthalate: PET) so as to have insulation properties. The insulator 55 covers each conductor 54.

The shield film 56 is made of aluminum alloy, and covers the insulator 55, that is the flat cable 52, as shown in FIGS. 10-12. The shield film 56 prevents that electric noise from an outside of the conductor 54 comes into the conductor 54. The shield film 56 and the conductor 54 are connected electrically to each other by connection, such as ultrasonic welding. For connecting by ultrasonic vibration, a copper foil 57 with slightly narrower width than that of the conductor 54 is piled on a surface of the shield film 56, in other word, the conductor 54, the insulator 55, the shield film 56 and the copper foil 57 are piled in order, and clamped between tools (not shown) for ultrasonic welding. Pressing it in a direction to approach the tools to each other, at least one of the tools is vibrated ultrasonically. Thereby, frictional heat is generated and the insulator 55 is melted. Thus, removing the insulator 55, the conductor 54 and shield film 56 are connected as shown in FIG. 12.

The terminal 53 is connected electrically to the conductor 54 of the shielded FFC 51 structured as mentioned above, as shown in FIGS. 10, 11A. The terminal 53 includes a wire connecting portion 58 to be joined with the flat cable 52 and an electric contact portion 59 continued to the wire connecting portion 58. The wire connecting portion 58 includes a bottom wall 60a and a clamping blade 61 extending perpendicularly from the bottom wall 60a.

The clamping blade 61 is pierced through the conductor 54 and the insulator 55 at an end portion 62 of the flat cable 52 exposed from the shield film 56, and is bent for clamping. Thereby, the clamping blade 61, that is terminal 53, is connected electrically with the conductor 54 of the flat cable 52.

The electric contact portion 59 includes a bottom wall 60b continued to the bottom wall 60a of the wire connecting portion 58, and is formed into tube shape. The electric contact portion 59 is connected electrically to a mating terminal (not shown). The terminal 53 is received in a connector housing (not shown) and fitted to the mating terminal (not shown). Thereby, the terminal 53 connects electrically the conductor 54 of the flat cable 52 and the mating terminal (not shown).

SUMMARY OF THE INVENTION

Objects to be Solved

According to the usual shielded FFC 51, the shield film 56 and the conductor 54 of the flat cable 52, on which the copper foil 57 is piled, are joined by ultrasonic welding. Therefore, for assembling the flat cable 52, a process of bending the clamping blade 61 and an additional process of ultrasonic welding are required. Thus, assembling process is increased and an efficiency of acting the process is low. The flat cable 52 covered with the insulator 55, the shield film 56 and the copper foil 57 are piled in order, and welded by ultrasonic welding. Since the insulator 55 exists between the conductor 54 of the flat cable 52 and shield film 56, the insulator 55 cannot be possibly removed securely, thereby the shield film 56 and the flat cable 52 are possibly not joined securely.

To overcome the above problems, objects of this invention are to provide a method of shielding a flat circuit body, which can improve an efficiency of assembling a shield film and reliability thereof, and a wiring harness including such shielded flat circuit.

How to Attain the Object of the Present Invention

In order to attain the objects of the present invention, a method of shielding a flat circuit body, which includes a conductor and an insulator to cover the conductor, includes the steps of: covering the flat circuit body with a conductive shield film; and piercing the conductor of the flat circuit body and the shield film together with a joint terminal for connecting them electrically.

The method of shielding according to the present invention is further characterized in the method of shielding mentioned above by that the joint terminal connects the conductors of a plurality of the flat circuit bodies to each other.

The method of shielding according to the present invention is further characterized in the method of shielding mentioned above by that the method further includes the steps of: piercing a clamp blade of a connector terminal to be mounted at an end of the flat circuit body through the flat circuit body, the end of which is exposed from the shield film; bending the clamp blade so as to connect the conductor of the flat circuit body and the connector terminal electrically with each other; piercing a joint blade of the joint terminal through both the shield film and the flat circuit body; and bending the joint blade so as to connect the conductor of the flat circuit body and the shield film electrically with each other, and the clamp blade and the joint blade are pierced through the flat circuit body along a same direction.

A shielded flat circuit body according to the present invention includes a flat circuit body having a conductor and an insulator covering the conductor, a conductive shield film covering the flat circuit body, and a joint terminal pierced through the conductor of the flat circuit body and the shield film so as to connect them electrically.

The shielded flat circuit body according to the present invention is further characterized in the shielded flat circuit body as mentioned above in that the joint terminal connects the conductors of a plurality of flat circuit bodies to each other.

The shielded flat circuit body according to the present invention is further characterized in the shielded flat circuit body as mentioned above in that the shielded flat circuit body further includes a connector terminal having a clamp blade to be mounted at an end of the flat circuit body, the end of the flat circuit body exposed from the shield film, and the clamp blade of the connector terminal is pierced through said flat circuit body and is bent so as to connect the conductor of the flat circuit body and the connector terminal electrically with each other; and a joint blade of the joint terminal is pierced through both the shield film and the flat circuit body; and the joint blade is bent so as to connect the conductor of the flat circuit body and the shield film electrically with each other, and the clamp blade and the joint blade are pierced through the flat circuit body along a same direction.

A wiring harness according to the present invention includes the shielded flat circuit body as mentioned above.

EFFECTS OF THE INVENTION

As mentioned above, according to the present invention, by piercing the joint terminal through the flat circuit body and the shield film, the conductor of the flat circuit body and the shield film are connected electrically, so that for assembling the shielded flat circuit body, the process of ultrasonic welding is not required. Thereby, the method of shielding the flat circuit body according to the present invention can improve the efficiency of process for assembling the shield film. Even if an insulation material exists between the conductor of the flat circuit body and the shield film, the joint terminal is pierced through the flat circuit and the shield film, so that the flat circuit body and the shield film can be fixed securely and the conductor of the flat circuit body and the shield film can be connected securely and electrically through the joint terminal. Thus, the method of shielding the flat circuit body according to the present invention can improve reliability of the process of assembling the shield film.

Since the joint terminal connects conductors of the plurality of flat circuit body to each conductor, an additional component is not required. Thereby, according to the method of shielding, kind of components for the flat circuit body can be reduced, and an efficiency of assembling the shield film can be improved.

Since the clamp blade of the connecting terminal and the joint blade of the joint terminal are pierced through the flat circuit body in the same direction, the process for connecting the conductor of the flat circuit body and the connecting terminal and the process for connecting the conductor of the flat circuit body and shield film and fixing the flat circuit body and the shield film with the joint terminal can be acted simultaneously. Therefore, according to the method of shielding, the efficiency of assembling the shield film can be improved, and the reliability of assembling the shield film can be improved also.

Since the flat circuit body and the shield film are pierced by the joint terminal for connecting them electrically, the process of ultrasonic welding is not required. Even if an insulation material exists between the conductor of the flat circuit body and the shield film, the joint terminal is pierced through the flat circuit body and the shield film, so that the flat circuit body and the shield film can be fixed securely and the conductor of the flat circuit body and the shield film can be connected securely and electrically through the joint terminal. Thus, the shielded flat circuit body according to the present invention can improve reliability of the process of assembling the shield film.

Since the joint terminal connects conductors of the plurality of flat circuit body to each conductor, an additional component is not required. Thereby, according to the shielded flat circuit body, kind of components for the flat circuit body can be reduced, and an efficiency of assembling the shield film can be improved.

Since the clamp blade of the connecting terminal and the joint blade of the joint terminal are pierced through the flat circuit body in the same direction, the process for connecting the conductor of the flat circuit body and the connecting terminal and the process for connecting the conductor of the flat circuit body and shield film and fixing the flat circuit body and the shield film with the joint terminal can be acted simultaneously. Therefore, according to the shielded flat circuit body, the efficiency of assembling the shield film can be improved, and the reliability of assembling the shield film can be improved also.

The wiring harness according to the present invention includes one of the shielded flat circuit bodies as mentioned above. For assembling the shielded flat circuit body, the process of ultrasonic welding is not required. Thereby, the wiring harness can improve the reliability of assembling the shield film.

The above and other objects and features of this invention will become more apparent from the following description taken in conjunction with the accompanying drawings.

BRIEF DESCRIPTION OF THE DRAWINGS

FIG. 5 is an expanded cross-sectional view showing an important area including a point of connecting a conductor of a FFC of the shielded flat circuit body and a shield film with the joint terminal shown in FIG. 4A;

FIG. 7 is a perspective view showing the joint terminal shown in FIG. 6 viewed in an opposite direction;

FIG. 9 an expanded cross-sectional view showing an important area including a point of connecting conductors of a plurality of FFCs to each other with the joint terminal shown in FIG. 8A;

DESCRIPTION OF THE PREFERRED EMBODIMENT

Figure 1:
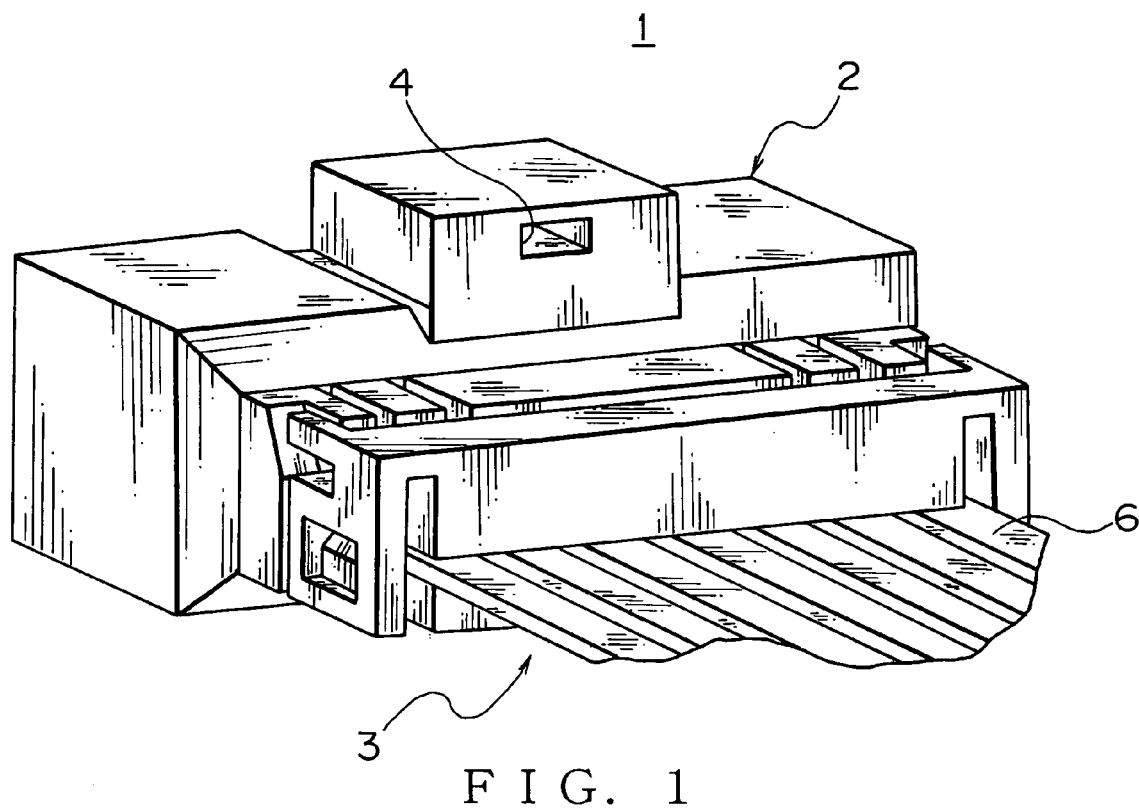
FIG. 1 is a perspective view of a wiring harness of an embodiment according to the present invention.

A method of shielding a flat circuit body, a shielded flat circuit body and a wiring harness of each embodiment according to the present invention will be described with reference to FIGS. 1-7. A wiring harness 1 includes a connector housing 2 (call female housing hereafter) and a shielded flat circuit body 3.

The female housing 2 is made of insulating synthetic resin, and formed into a flat box-shape. The female housing 2 includes a terminal receiving section (not shown) for receiving a later-described connecting terminal 7 and a lock hole 4. A plurality of the terminal receiving sections extending linearly is arranged in parallel to each other. Each terminal receiving section receives the connecting terminal 7 therein, so that the female housing 2 receives the plurality of the connecting terminals 7. The lock hole 4 is formed by recessing from an outer surface of the female housing 2. A lock projection (not shown) of a connector housing (not shown) of a later-described mating connector (not shown) comes into the lock hole 4.

The mating connector includes the mating connector housing (call male housing hereafter) and a mating terminal (call male terminal). The male housing has the lock projection to come into the lock hole 4. The male housing receives male terminals, and fits to the female housing 2 by engaging the lock projection with the lock hole 4 of the female housing 2. The male terminal has an inserting portion (not shown) to insert into an electric contact portion 11 of the connecting terminal 7. The inserting portion is formed into a blade shape. The male terminal including the inserting portion is made of a conductive metal. The female housing 2 fits to the male housing of the mating connector (not shown), thereby it structures the wiring harness 1.

The shielded flat circuit body 3 includes a flexible flat cable (FFC) 5, a shield film 6, the connecting terminal 7 and a joint terminal 19.

Figure 2:
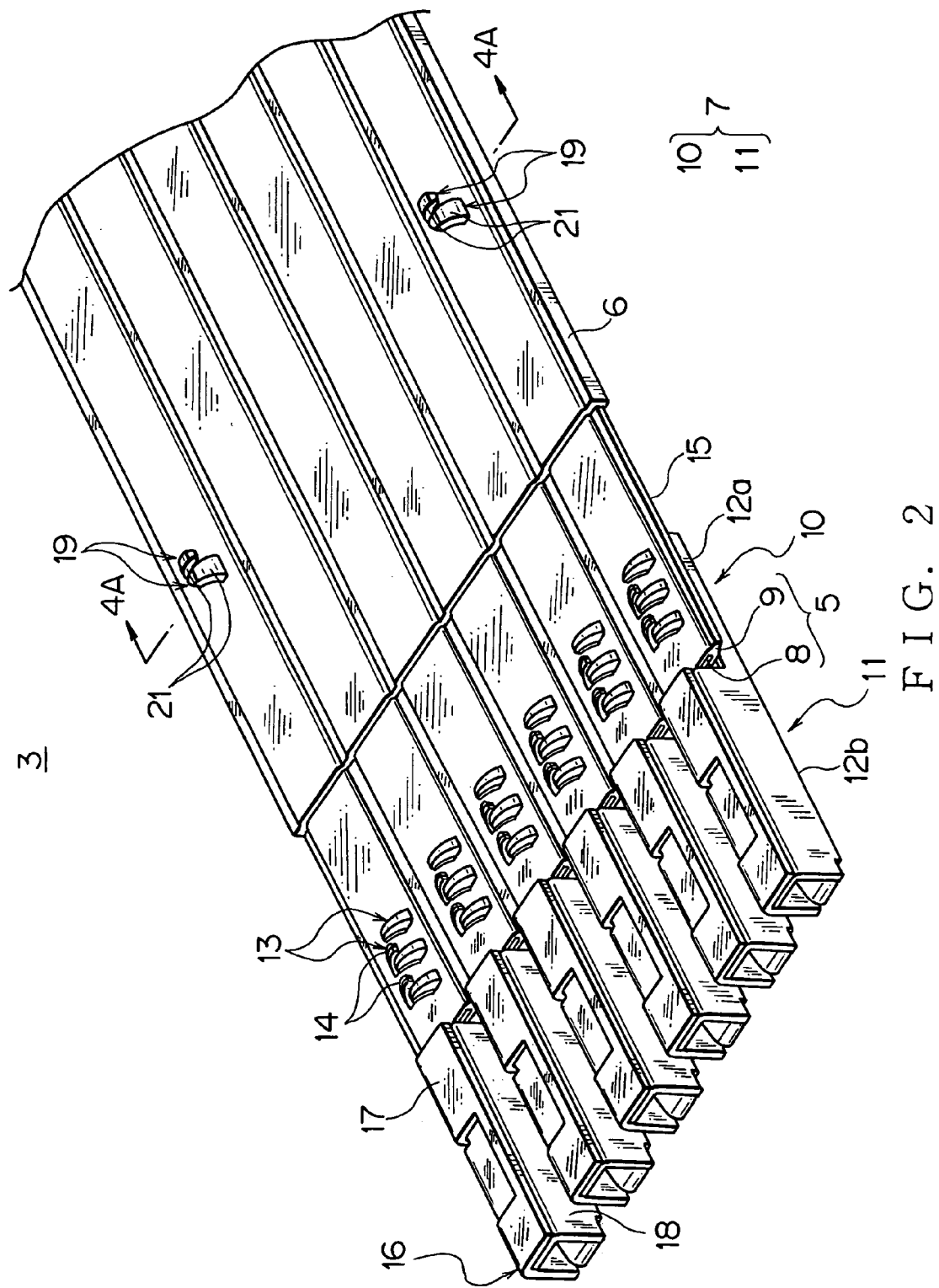
FIG. 2 is a perspective view of a shielded flat circuit body of the wiring harness shown in FIG. 1.
Figure 4A:
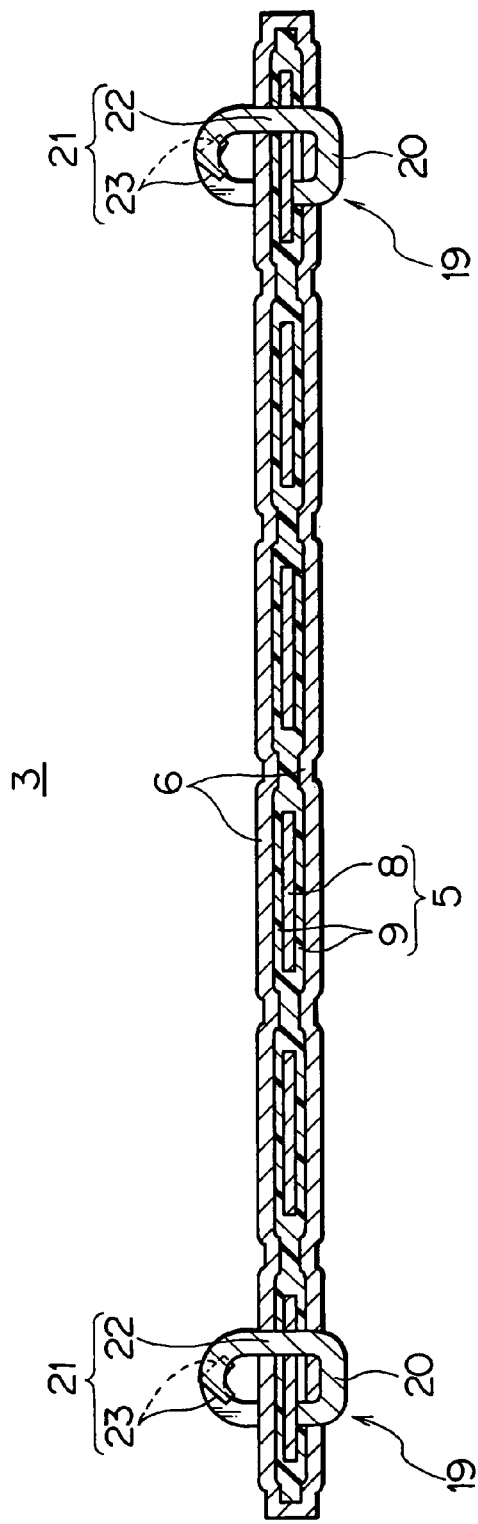
FIG. 4A is a cross-sectional view taken along the line 4A-4A in FIG. 2.
Figure 8A:
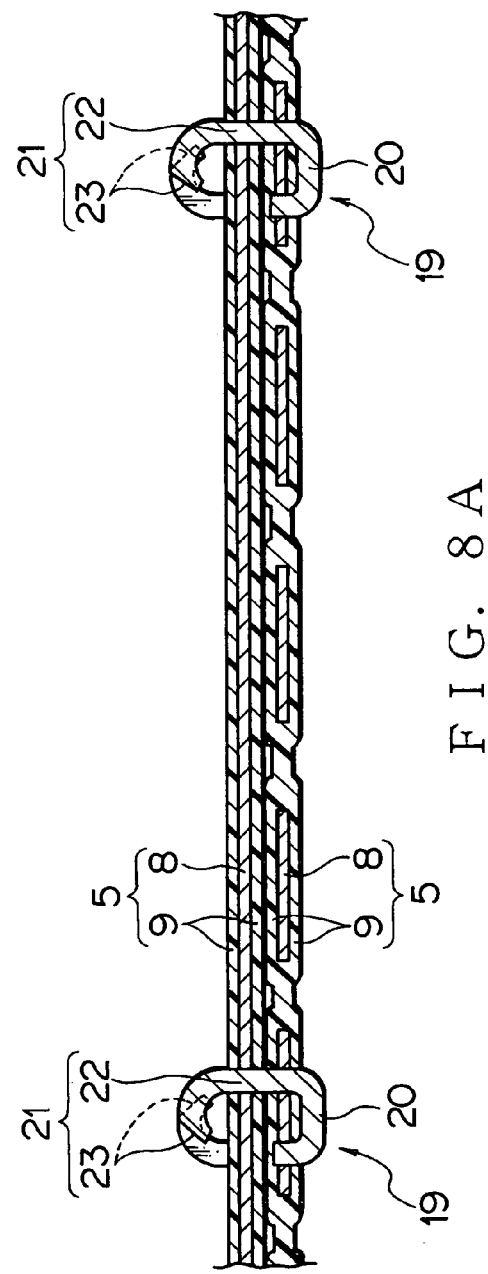
FIG. 8A is a cross-sectional view taken along the line 8A-8A in FIG. 6.
Figure 6:
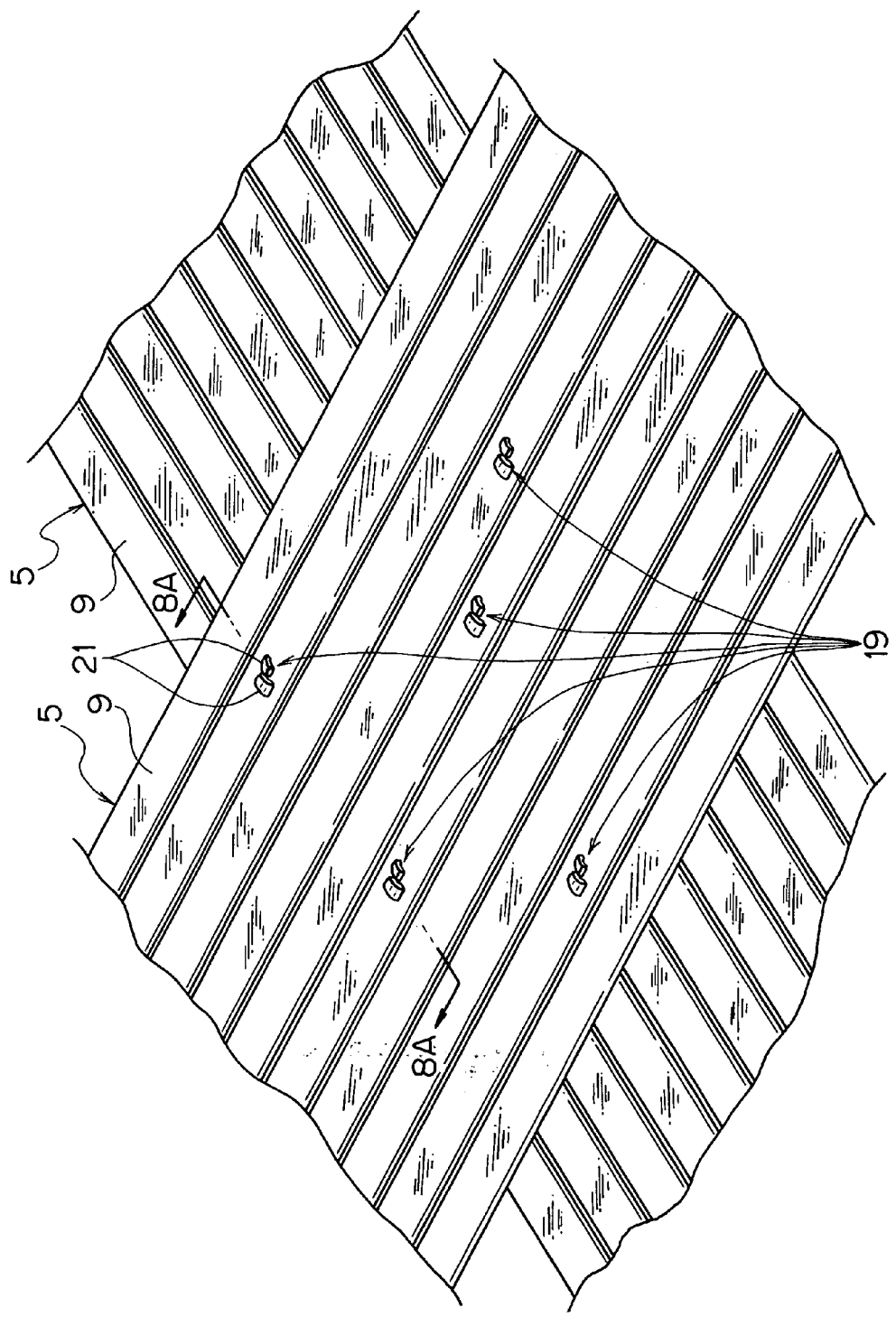
FIG. 6 is a perspective view of the joint terminal shown in FIG. 3 connecting conductors of a plurality of the FFCs to each conductor.
Figure 10:
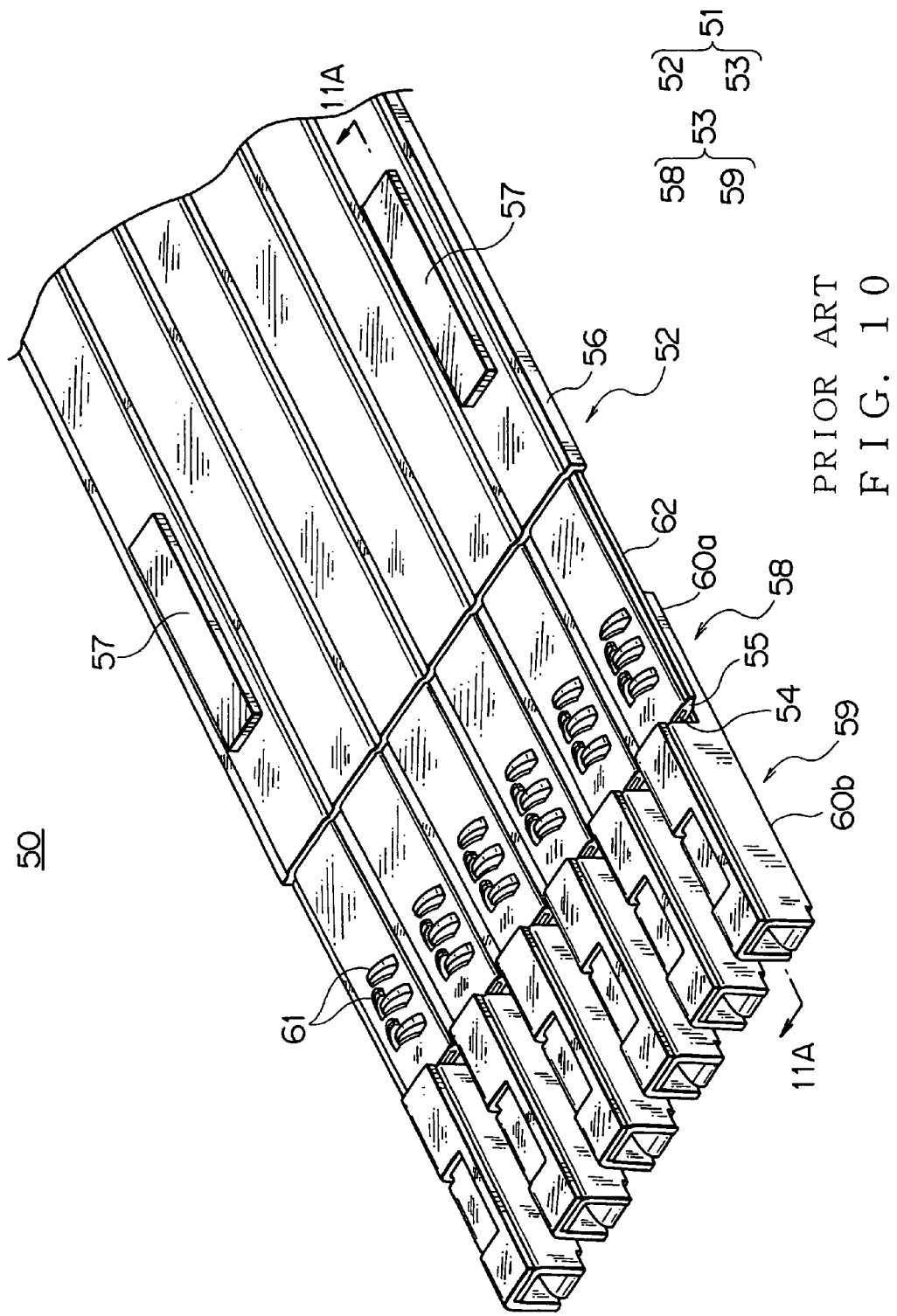
FIG. 10 is a perspective view showing a shielded FFC of a wiring harness by prior art.
Figure 11A:
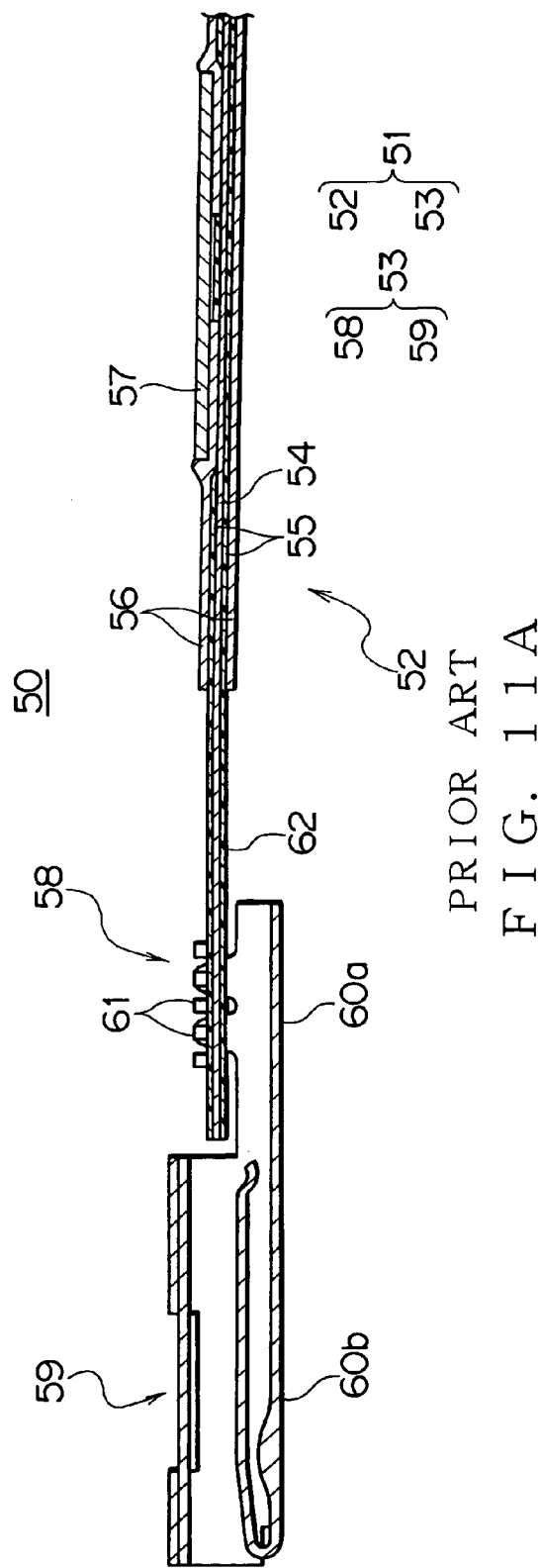
FIG. 11A is a cross-sectional view taken along the line 11A-11A in FIG. 10.
Figure 12:
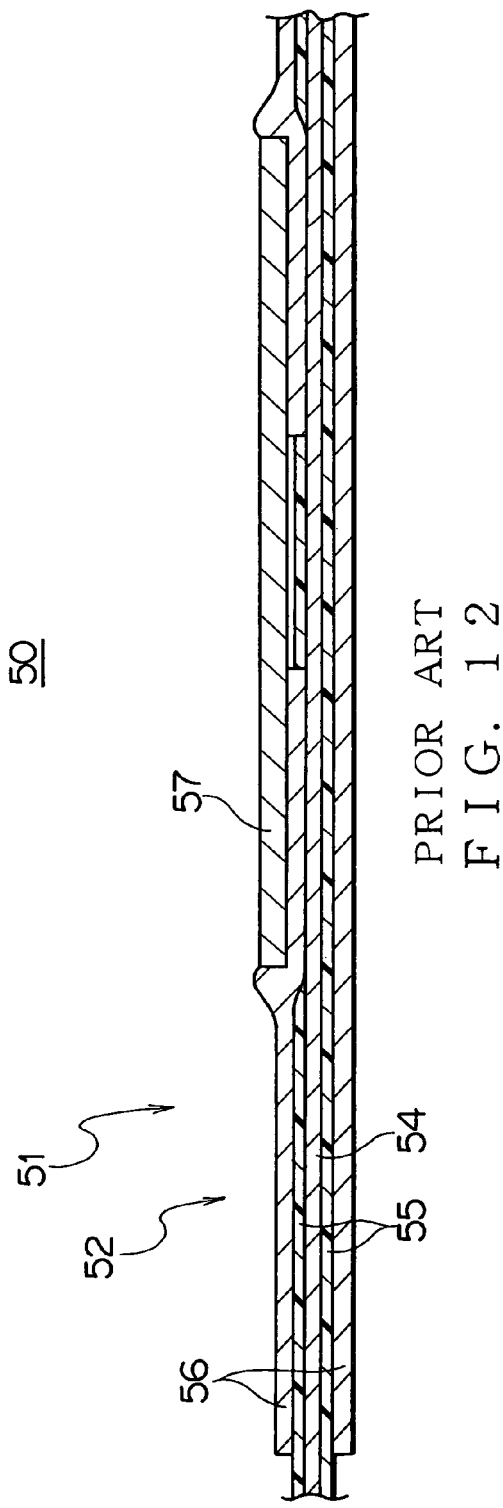
FIG. 12 is an expanded cross-sectional view showing an important area including a point of joining a conductor of the shielded FFC and a shield film shown in FIG. 11A.

The FFC 5 corresponds to a flat circuit body. The flat circuit body has a plurality of conductors and an insulator covering the conductors, and formed into a flat band shape. The FFC 5 includes a plurality of conductors 8 and an insulator 9 covering the conductors 8 as shown in FIGS. 2, 4A, 5.

The conductor 8 is made of a conductive metal. The conductor 8 includes at least copper or copper alloy. The conductor 8 is formed to have a rectangular cross-section. The conductor 8 extends in one direction. The plurality of conductors 8 is in parallel to each other.

The insulator 9 is made of insulating synthetic resin and formed into a band shape. For example, the insulator 9 is made of polyethyleneterephthalate (PET). The insulator 9 covers the conductors 8 by receiving the conductors 8 inside the insulator 9.

The shield film 6 is made of a conductive metal, such as aluminium. The shield film 6 is formed into a thin sheet shape, and covers the FFC 5 all around as shown in FIGS. 2, 4A. In other words, the shield film 6 receives the FFC 5 inside itself. The shield film 6 covering the FFC 5 is pierced together with the FFC 5 by the later-described joint terminal 19 so as to be fixed to the FFC 5 and connected electrically to the conductor 8 of the FFC 5. The shield film 6 is connected to a required earth ground.

The connecting terminal 7 is received into the female housing 2, and connected electrically to the inserting portion of the mating male terminal received in the male housing of the mating connector and the conductor 8 of the FFC 5. The mating male terminal is for example a male tab such as a bus bar, and a connecting terminal of an electric component like a relay or a fuse.

The connecting terminal 7 is formed by punching a conductive sheet metal and bending it. The connecting terminal 7 has a wire connecting portion 10 to be connected electrically to the FFC 5 and an electric contact portion 11 to be connected electrically to the inserting portion of the mating male terminal.

The wire connecting portion 10 has a bottom wall 12a and a plurality of clamp pieces 13 continued to a side edge in widthwise of the bottom wall 12. The bottom wall 12a is formed into a rectangular flat plate shape in a plan view. An end 15 of the FFC 5, which is not covered, that is the insulator 9 thereof is exposed, is piled on the bottom wall 12a. The clamp piece 13 has a clamp blade 14. The clamp pieces 13 are continued respectively to the both edges in widthwise of the bottom wall 12a.

The clamp blade 14 is formed to narrow gradually in accordance with departing from the bottom wall 12a. The clamp blade 14 is pierced into the end 15 of the FFC 5, which is not covered with the shield film 6, that is the insulator 9 thereof is exposed, and piled on the bottom wall 12a. By making the clamp blade 14 and the end of the FFC 5 closer to each other, the clamp blade 14 is pierced through the conductor 8 and the insulator 9 at the end 15 of the FFC 5. The clamp blade 14 pierced through the FFC 5 is bent so as to make a top end of the clamp blade 14 turn toward the bottom wall 12a. Thereby, the clamp blade 14, that is the connecting terminal 7, is connected electrically with the conductor 8 of the FFC 5 as shown in FIG. 2.

The electric contact portion 11 is continued to the wire connecting portion 10 as shown in FIG. 2. The electric contact portion 11 has a tube 16, into which the inserting piece comes. The tube 16 includes a flat bottom wall 12b, a top wall 17 opposing through a space to the bottom wall 12b, a pair of side walls 18 making the bottom wall 12b and the top wall 17 connect to each other, and an elastic piece (not shown) connecting electrically to the inserting portion. The bottom wall 12b is continued to the bottom wall 12a so as to be an integrated plate.

The bottom wall 12b is formed into a rectangular shape in a plan view. The bottom wall 12b has a substantially same width as that of the bottom wall 12a of the wire connecting portion 10. The top wall 17 is formed into a rectangular shape in a plan view so as to have a substantially same shape as that of the bottom wall 12b. The top wall 17 is arranged in parallel to the bottom wall 12b.

Each side wall 18 continues respectively to the both edges in widthwise of the bottom wall 12b and to the both edges in widthwise of the top wall 17. The side walls 18 are arranged in parallel to each other.

The tube 16 formed as mentioned above receives the inserting piece inside the tube 16. In other words, the inserting piece is located between the bottom wall 12b and the top wall 17, and between the pair of side walls 18. The inserting piece is inserted into and pulled out inside of the tube 16 along lengthwise directions of the bottom wall 12b and the top wall 17. Thereby, in the tube 16 of the connecting terminal 7, the inserting piece inserted into the tube 16 touches to the elastic piece to be connected electrically with the connecting terminal 7.

According to the shielded flat circuit body 3 structured as mentioned above, the joint terminal 19 for connecting conductors 8 of the plurality of the FFCs 5 to each other is pierced through the conductor 8 of the FFC 5, the insulator 9 and the shield film 6 and is bent. Thereby, the conductor 8 of the FFC 5 and the shield film 6 are connected electrically.

Figure 3:
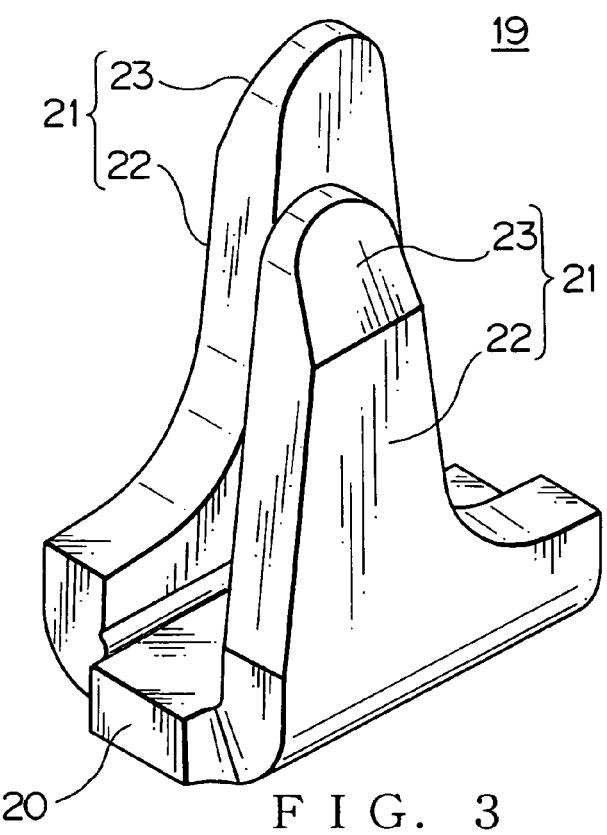
FIG. 3 is a perspective view of a joint terminal of the shielded flat circuit body shown in FIG. 2.

The joint terminal 19 has a bottom wall 20 and a pair of joint blades 21 as shown in FIG. 3. The bottom wall 20 is formed into a plate shape. Each the pair of joint terminals 21 has a plate-like blade top body 22 and a sharp edge 23.

The blade top body 22 projects respectively from the both sides of the bottom wall 20. The blade top body 22 is formed to narrow gradually in accordance with departing from the bottom wall 20.

The sharp edge 23 is provided at a top end of the blade top body 22 apart from the bottom wall 20. The sharp edge 23 is formed to make a thickness of the blade top body 22 thinner in accordance with departing from the bottom wall 20. By making the joint blade 19 and the FFC 5 covered with the shield film 6 closer to each other, the sharp edge 23 is pierced through the conductor 8 and the insulator 9 of the FFC 5 and the shield film 6. The sharp edge 23 pierced through the FFC 5 and the shield film 6 is bent toward the bottom wall 20. Thereby, the sharp edge 23, that is the joint blade 19, fixes the FFC 5 and the shield film 6 as shown in FIGS. 4A, 5, and connects electrically the conductor 8 of the FFC 5 and the shield film 5 through the joint terminal 19.

The joint terminal 19 also is pierced through respective conductors 8, 8 and the insulators 9, 9 of the FFCs 5, 5 piled to each other and is bent so as to connect the conductors 8, 8 to each other of the FFCs 5, 5 as shown in FIGS. 6-9. Thus, the joint terminal 19 is a terminal for connecting the conductors 8, 8 of the plurality of FFCs 5, 5 to each other.

Process steps of connecting electrically the conductor 8 of the FFC 5 and the shield film 6 with the joint terminal 19 will be described herein. Firstly, the clamp blade 14 of the clamp piece 13 is approached to the end 15, which is not covered with the shield film 6 of the FFC 5, that is the insulator 9 is exposed, to pieces the end 15, so as to piece through the insulator 9 and the conductor 8 of the FFC 5. After the clamp blade 14 pieces through the FFC 5, a top end of the clamp blade 14 is bent toward the bottom wall 12a. Thus, the FFC 5 and the connecting terminal 7 are fixed as shown in FIG. 2, and the conductor 8 of the FFC 5 and the clamp piece 13 are connected electrically to each other. In other words, the conductor 8 of the FFC 5 and the connecting terminal 7 are connected electrically to each other.

The sharp edge 23 of the joint terminal 19 is approached in the same direction of piercing the clamp blade 14 to the FFC 5 covered with the shield film 6 to be pieced into the FFC 5 so as to be pieced through the insulator 9 and the conductor 8 of the FFC 5. After the sharp edge 23 is pieced through the FFC 5, the sharp edge 23 is bent toward the bottom wall 20. Thus, the sharp edge 23, that is the joint terminal 19, fixes the FFC 5 and the shield film 6, and connects the conductor 8 of the FFC 5 and the shield film 6 electrically to each other through the joint terminal 19 as shown in FIGS. 4A, 5. The shielded flat circuit body 3 is assembled in the wiring harness 1 and wired in a car.

According to the embodiment, the clamp blade 14 is pierced through the FFC 5 and bent so as to be connected electrically to the conductor 8 of the FFC 5. Thus, the clamp blade 8, that is the connecting terminal 7, is connected electrically to the conductor 8 of the FFC 5.

The joint terminal 19 is pierced through the FFC 5 and the shield film 6 and bent so as to connect the conductor 8 of the FFC 5 and the shield film 6 electrically through the joint terminal 19. Thus, the joint terminal 19 connects the conductor 8 of the FFC 5 and the shield film 6 electrically.

Since the conductor 8 of the FFC 5 and the shield film 6 are electrically connected by piercing the joint terminal 19 through them, a process of ultrasonic welding is not required for assembling the shielded flat circuit body 3. Thereby, according to the method of shielding the flat circuit body by the present invention, efficiency of a process for assembling the shield film 6 can be improved. Although the insulator 9 exits between the conductor 8 of the FFC 5 and the shield film 6, since the joint terminal 19 is pierced through the FFC 5 and the shield film 6, the FFC 5 and the shield film 6 can be fixed together securely, and the conductor 8 of the FFC 5 and the shield film 6 can be connected securely through the joint terminal 19. Thus, the method of shielding the flat circuit body according to the present invention can improve the reliability of the process of assembling the shield film 6.

The conductors 8 of the plurality of FFCs 5 are connected by the joint terminal 19 and thereby additional components are not required. Thus, the method of shielding the flat circuit body according to the present invention can reduce kinds of components for the shielded flat circuit body and improve the efficiency of the process of assembling the shield film 6.

The clamp blade 14 of the connecting terminal 7 and the joint blade 21 of the joint terminal 19 are pierced through the FFC 5 in the same direction. The process for connecting the conductor 8 of the FFC 5 and the connecting terminal 7 and the process for connecting the conductor 8 of the FFC 5 and the shield film 6 and fixing the FFC 5 and the shield film 6 with the joint terminal 19 can be acted simultaneously. Therefore, according to the method of shielding the flat circuit body, the efficiency of assembling the shield film 6 can be improved. The FFC 5 and the shield film 6 are fixed to each other securely and the conductor 8 of the FFC 5 and the shield film 6 are connected securely through the joint terminal 19, so that the reliability of assembling the shield film 6 can be improved also.

Since the FFC 5 and the shield film 6 are pierced by the joint terminal 19 for connecting the conductor 8 of the FFC 5 and the shield film 6 electrically, the process of ultrasonic welding is not required. Therefore, according to the method of shielding the flat circuit body, the efficiency of assembling the shield film 6 can be improved. Even if the insulator 9 exists between the conductor 8 of the FFC 5 and the shield film 6, the joint terminal 19 is pierced through the FFC 5 and the shield film 6, and thereby the FFC 5 and the shield film 6 can be fixed securely, and the conductor 8 of the FFC 5 and the shield film 6 can be connected securely and electrically through the joint terminal 19. Thus, the shielded flat circuit body 3 according to the present invention can improve reliability of the process of assembling the shield film 6.

Since the joint terminal 19 connects the conductors 8 of the plurality of FFCs 5 to each conductor, an additional component is not required. Thereby, according to the method of shielding, kind of components for the shielded flat circuit body can be reduced, and the efficiency of assembling the shield film 6 can be improved.

Since the clamp blade 14 of the connecting terminal 7 and the joint blade 21 of the joint terminal 19 are pierced through the FFC 5 in the same direction, the process for connecting the conductor 8 of the FFC 5 and the clamp blade 14, that is the connecting terminal 7, and the process for connecting the conductor 8 of the FFC 5 and shield film 6 and fixing the FFC 5 and the shield film 6 with the joint terminal 19 can be acted simultaneously. Therefore, according to the method of shielding, the efficiency of assembling the shield film 6 can be improved, and the reliability of assembling the shield film 6 can be improved also.

The wiring harness 1 according to the present invention includes one of the shielded flat circuit bodies 3 as mentioned above. For assembling the shielded flat circuit body 3, the process of ultrasonic welding is not required. Thereby, the wiring harness can improve the efficiency and the reliability of assembling the shield film 6.

In the above embodiment, the FFC 5 is applied as the flat circuit body. According to the present invention, the FPC (flexible printed circuit) can be also applied as the flat circuit body.

In the above embodiment, the female connecting terminal 7 is applied as the connecting terminal. According to the present invention, a male connecting terminal can be also applied as the connecting terminal. The male connecting terminal may be connected to the conductor 8 of the FFC 5. The male connecting terminal may have a clamp blade 14.

In the above embodiment, the joint terminal 19 can connect the conductors 8 of the plurality of FFCs 5 to each conductor. According to the present invention, any kind of terminals, which can be pierced through the FFC 5 and the shield film 6 so as to connect the conductor 8 of the FFC 5 and the shield film 6, can be applied as the joint terminal.

In the above embodiment, the clamp blade 14 is pierced through the FFC 5 and is bent previously to the joint blade 21. In order of assembling the joint blade 21 and the clamp blade 14, that is the joint terminal 19 and clamp piece 13 in the FFC 5, after the joint blade 21 is pierced through the FFC 5 and is bent, the clamp blade 14 may be pierced through the FFC 5 and be bent. According to the present invention, after assembling the joint terminal 19 in the FFC 5, the clamp piece 13 can be assembled.

Although the present invention has been fully described by way of examples with reference to the accompanying drawings, it is to be noted that various change and modifications can be made with the scope of the present invention.

What is claimed is:

1. A method for shielding a flat circuit body, which includes a conductor and an insulator to cover said conductor, comprising the steps of:
   covering said flat circuit body with a conductive shield film; and
   piercing said conductor of the flat circuit body and simultaneously piercing said shield film together with a joint terminal so as to directly electrically connect the conductor of the flat circuit body and said shield film.

2. The method of shielding according to claim 1, wherein said joint terminal connects the conductors of a plurality of said flat circuit bodies to each other.

3. A method of shielding a flat circuit body, which includes a conductor and an insulator to cover said conductor, comprising the steps of:
   covering said flat circuit body with a conductive shield film;
   piercing said conductor of the flat circuit body and said shield film together with a joint terminal for connecting them electrically;
   piercing a clamp blade of a connector terminal to be mounted at an end of the flat circuit body, which end is not covered with the conductive shield film, through said flat circuit body;
   bending said clamp blade so as to connect the conductor of the flat circuit body and the connector terminal electrically with each other;
   piercing a joint blade of said joint terminal through both the shield film and the flat circuit body; and
   bending said joint blade so as to connect the conductor of the flat circuit body and the shield film electrically with each other,
   wherein the clamp blade and the joint blade are pierced through the flat circuit body along a same direction.

4. A shielded flat circuit body comprising:
   a flat circuit body having a conductor and an insulator covering said conductor;
   a conductive shield film covering the flat circuit body; and
   a joint terminal pierced through said conductor of the flat circuit body and simultaneously through said shield film so as to directly connect them electrically.

5. The shielded flat circuit body according to claim 4, wherein said joint terminal connects the conductors of a plurality of said flat circuit bodies to each other.

6. A wiring harness comprising the shielded flat circuit body as claimed in claim 4 or 5.

7. The shielded circuit body comprising:
   a flat circuit body having a conductor and an insulator covering said conductor;
   a conductive shield film covering the flat circuit body;
   a joint terminal pierced through said conductor of the flat circuit body and said shield film so as to connect them electrically; and
   a connector terminal having a clamp blade to be mounted at an end of the flat circuit body, which end is not covered with the conductive shield film;
   wherein said clamp blade of the connector terminal is pierced through said flat circuit body and is bent so as to connect the conductor of the flat circuit body and the connector terminal electrically with each other;
   wherein a joint blade of said joint terminal is pierced through both the shield film and the flat circuit body; and
   said joint blade is bent so as to connect the conductor of the flat circuit body and the shield film electrically with each other, and
   wherein the clamp blade and the joint blade are pierced through the flat circuit body along a same direction.

8. A wiring harness comprising the shielded flat circuit body as claimed in claim 7.

* * * * *